United States Patent
Stockert

(10) Patent No.: US 7,256,650 B1
(45) Date of Patent: Aug. 14, 2007

(54) VSWR TOLERANT POWER DETECTOR

(75) Inventor: Terry Stockert, Cedar Rapids, IA (US)

(73) Assignee: RF Micro Devices, Inc., Greensboro, NC (US)

( * ) Notice: Subject to any disclaimer, the term of this patent is extended or adjusted under 35 U.S.C. 154(b) by 130 days.

(21) Appl. No.: 11/067,800

(22) Filed: Feb. 28, 2005

(51) Int. Cl.
*H03F 3/68* (2006.01)

(52) U.S. Cl. ................... 330/124 R; 330/295

(58) Field of Classification Search ........... 330/140
See application file for complete search history.

(56) References Cited

U.S. PATENT DOCUMENTS

| | | | |
|---|---|---|---|
| 4,431,970 A | 2/1984 | Sumi et al. ............ 329/103 |
| 6,265,943 B1 | 7/2001 | Dening et al. ............ 330/296 |
| 6,307,364 B1 | 10/2001 | Augustine ............ 324/95 |
| 6,459,889 B1* | 10/2002 | Ruelke ............ 455/296 |
| 6,525,611 B1 | 2/2003 | Dening et al. ............ 330/298 |
| 6,528,983 B1 | 3/2003 | Augustine ............ 324/95 |
| 6,720,831 B2 | 4/2004 | Dening et al. ............ 330/298 |
| 6,756,849 B2 | 6/2004 | Dupuis et al. ............ 330/279 |
| 6,845,232 B2* | 1/2005 | Darabi ............ 455/240.1 |
| 6,850,119 B2 | 2/2005 | Arnott ............ 330/298 |
| 2003/0054778 A1 | 3/2003 | Hecht ............ 455/115 |
| 2006/0132235 A1* | 6/2006 | Ozawa ............ 330/254 |

OTHER PUBLICATIONS

Eisele et al. "WAM 2.1: Balanced Transistor Amplifiers for Precise Wideband Microwave Applications," International Solid-State Circuits Conference, 1965.
Engelbrecht et al. "A Wide-Band Low Noise L-Band Balanced Transistor Amppifier," IEEE, vol. 53, Mar. 1965.
Nakamura et al. "Low Cost Coupling Methods for RF Power Detectors Replace Directional Couplers," Oct. 2002.

* cited by examiner

*Primary Examiner*—Robert Pascal
*Assistant Examiner*—Alan Wong
(74) *Attorney, Agent, or Firm*—Winthrow & Terranova, PLLC

(57) ABSTRACT

A system is provided for detecting the output power of power amplifier circuitry in a transmitter of a mobile terminal. Balanced power amplifier circuitry is provided having in-phase power amplifier circuitry and quadrature phase amplifier circuitry. A power detection system provides a power detection signal indicative of the output power of the balanced power amplifier circuitry based on an in-phase detect signal indicative of some measurable parameter that varies with power, such as current, in a final amplifier stage of the in-phase amplifier circuitry and a quadrature phase detect signal indicative of some measurable parameter that varies with power, such as current, in a final stage of the quadrature phase amplifier circuitry.

24 Claims, 6 Drawing Sheets

VSWR TOLERANT POWER DETECTOR

FIELD OF THE INVENTION

The present invention relates to detecting the output power of a mobile terminal, and more specifically relates to a system for detecting the output power of a power amplifier in the transmit chain of the mobile terminal that is tolerant to variations in load impedance.

BACKGROUND OF THE INVENTION

The output power of mobile terminals, such as mobile phones, Personal Digital Assistants (PDAs), and the like, is controlled by a power amplifier in the transmit chain. For open loop power amplifiers, the output power of the power amplifier, and thus the mobile terminal, is a function of the load impedance seen at the output of the power amplifier. Ideally, the load impedance is a constant load. However, in reality, there are variations in the load impedance due to variations in the impedance of the components in the transmit chain following the power amplifier, such as a duplexer, with frequency and temperature, and variations in the impedance of the antenna of the mobile terminal caused by proximity of the antenna to foreign metallic objects and the user's body. For open loop power amplifiers, the variations in the load impedance result in variations in the output power of the power amplifier. Such output power variations decrease the quality of service (QoS), increase the probability of dropped calls in fringe areas, increase the liability of mobile terminal manufacturers in terms of tolerated output power versus Specific Absorption Ratio (SAR), and increase the peak current of the power amplifier.

In order to reduce output power variations due to variations in the load impedance, it is desirable to detect the output power of the power amplifier. Traditional approaches for detecting the output power use a directional coupler at the output of the power amplifier to provide a signal representative of the output of the power amplifier to a power detector. The power detector then processes the signal to detect the output power of the power amplifier. However, the directional coupler is an additional component that adds loss to the transmit path, which reduces the efficiency of the mobile terminal, and increases the cost of manufacturing the mobile terminal.

Thus, there remains a need for a system for detecting the output power of a power amplifier that is tolerant to variations in load impedance and eliminates the need for a directional coupler.

SUMMARY OF THE INVENTION

The present invention provides a system for detecting the output power of power amplifier circuitry in a transmitter of a mobile terminal. In general, balanced power amplifier circuitry is provided having in-phase power amplifier circuitry and quadrature phase amplifier circuitry. A power detection system provides a power detection signal indicative of the output power of the balanced power amplifier circuitry based on an in-phase detect signal indicative of some measurable parameter that varies with power, such as current, in a final amplifier stage of the in-phase amplifier circuitry and a quadrature phase detect signal indicative of some measurable parameter that varies with power, such as current, in a final stage of the quadrature phase amplifier circuitry. In operation, a quadrature coupler converts a radio frequency (RF) input signal into an in-phase input signal and a quadrature phase input signal, which are provided to the in-phase amplifier circuitry and quadrature phase amplifier circuitry, respectively, for amplification. A quadrature combiner combines the amplified in-phase and quadrature phase signals to provide an amplified RF output signal.

The power detection system includes a first input coupled to an input of the final stage of the in-phase amplifier circuitry for receiving the in-phase detect signal and a second input coupled to an input of the final stage of the quadrature phase amplifier circuitry for receiving the quadrature phase detect signal. The power detection system operates to combine the in-phase detect signal and the quadrature phase detect signal to provide a combined detect signal. Detection circuitry within the power detection system provides the power detection signal based on the combined detect signal. More specifically, in one embodiment, the detection circuitry operates to rectify the combined detect signal and low-pass filter the rectified signal to provide the power detection signal.

In one embodiment, the power amplifier circuitry also includes phase shift circuitry for adjusting a phase of the in-phase detect signal prior to providing the in-phase detect signal to the power detection system. The phase shift circuitry operates to adjust the phase of the in-phase detect signal such that the in-phase detect signal and the quadrature phase detect signal are essentially in phase, thereby preventing a reduction in signal amplitude as a result of combining two out of phase signals.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
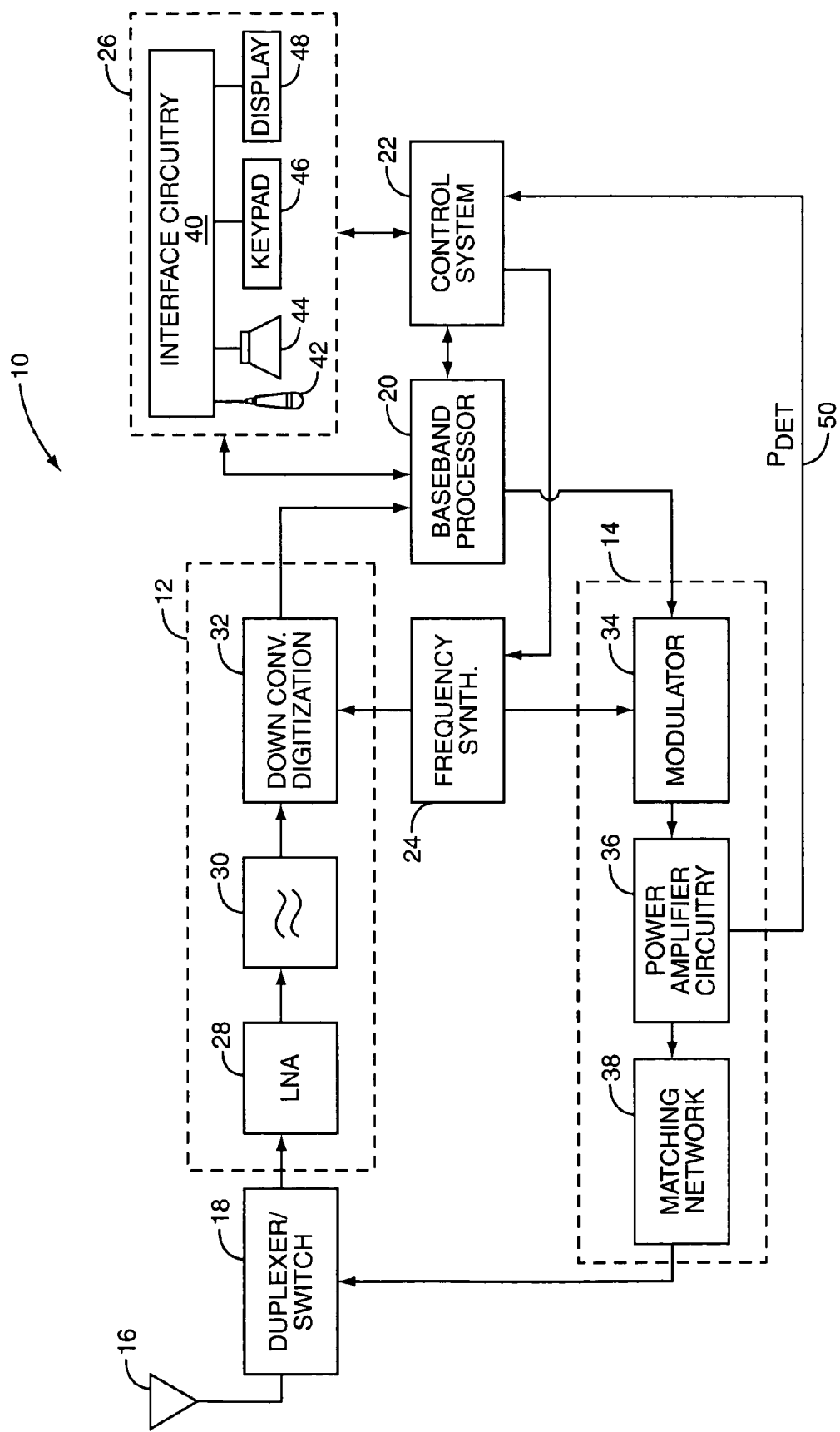
FIG. 1 illustrates an exemplary embodiment of a mobile terminal according to one embodiment of the present invention.

The present invention may be incorporated in a mobile terminal 10, such as a mobile telephone, wireless personal digital assistant, wireless Local Area Network (LAN) device, wireless base station, or like wireless communication device. The basic architecture of a mobile terminal 10 is represented in FIG. 1 and may include a receiver front end 12, a radio frequency transmitter section 14, an antenna 16, a duplexer or switch 18, a baseband processor 20, a control system 22, a frequency synthesizer 24, and an interface 26. The receiver front end 12 receives information bearing radio frequency signals from one or more remote transmitters provided by a base station. A low noise amplifier 28 amplifies the signal. A filter circuit 30 minimizes broadband interference in the received signal, while downconversion and digitization circuitry 32 downconverts the filtered, received signal to an intermediate or baseband frequency signal, which is then digitized into one or more digital streams. The receiver front end 12 typically uses one or more mixing frequencies generated by the frequency synthesizer 24.

The baseband processor 20 processes the digitized received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data, which may represent voice, data, or control information, from the control system 22, which it encodes for transmission. The encoded data is output to the radio frequency transmitter section 14, where it is used by a modulator 34 to modulate a carrier signal that is at a desired transmit frequency. Power amplifier circuitry 36 amplifies the modulated carrier signal to a level appropriate for transmission, and delivers the modulated carrier signal to antenna 16 through a matching network 38.

A user may interact with the mobile terminal 10 via the interface 26, which may include interface circuitry 40 associated with a microphone 42, a speaker 44, a keypad 46, and a display 48. The interface circuitry 40 typically includes analog-to-digital converters, digital-to-analog converters, amplifiers, and the like. Additionally, it may include a voice encoder/decoder, in which case it may communicate directly with the baseband processor 20.

The microphone 42 will typically convert audio input, such as the user's voice, into an electrical signal, which is then digitized and passed directly or indirectly to the baseband processor 20. Audio information encoded in the received signal is recovered by the baseband processor 20, and converted by the interface circuitry 40 into an analog signal suitable for driving speaker 44. The keypad 46 and display 48 enable the user to interact with the mobile terminal 10, input numbers to be dialed, address book information, or the like, as well as monitor call progress information.

The present invention provides an efficient way to detect the transmit power provided by the power amplifier circuitry 36 that is tolerant to variations in load impedance seen at the input to the duplexer or switch 18 resulting from changes in frequency and temperature and from the environment to which the antenna 16 is exposed. Typically, a signal indicative of transmit power, referred to as a power detection signal ($P_{DET}$) 50, is generated in the power amplifier circuitry 36 and fed back to the control system 22, which will react accordingly to control input signal levels, bias, gain, or a combination thereof in traditional fashion to control transmit power.

Figure 2A:
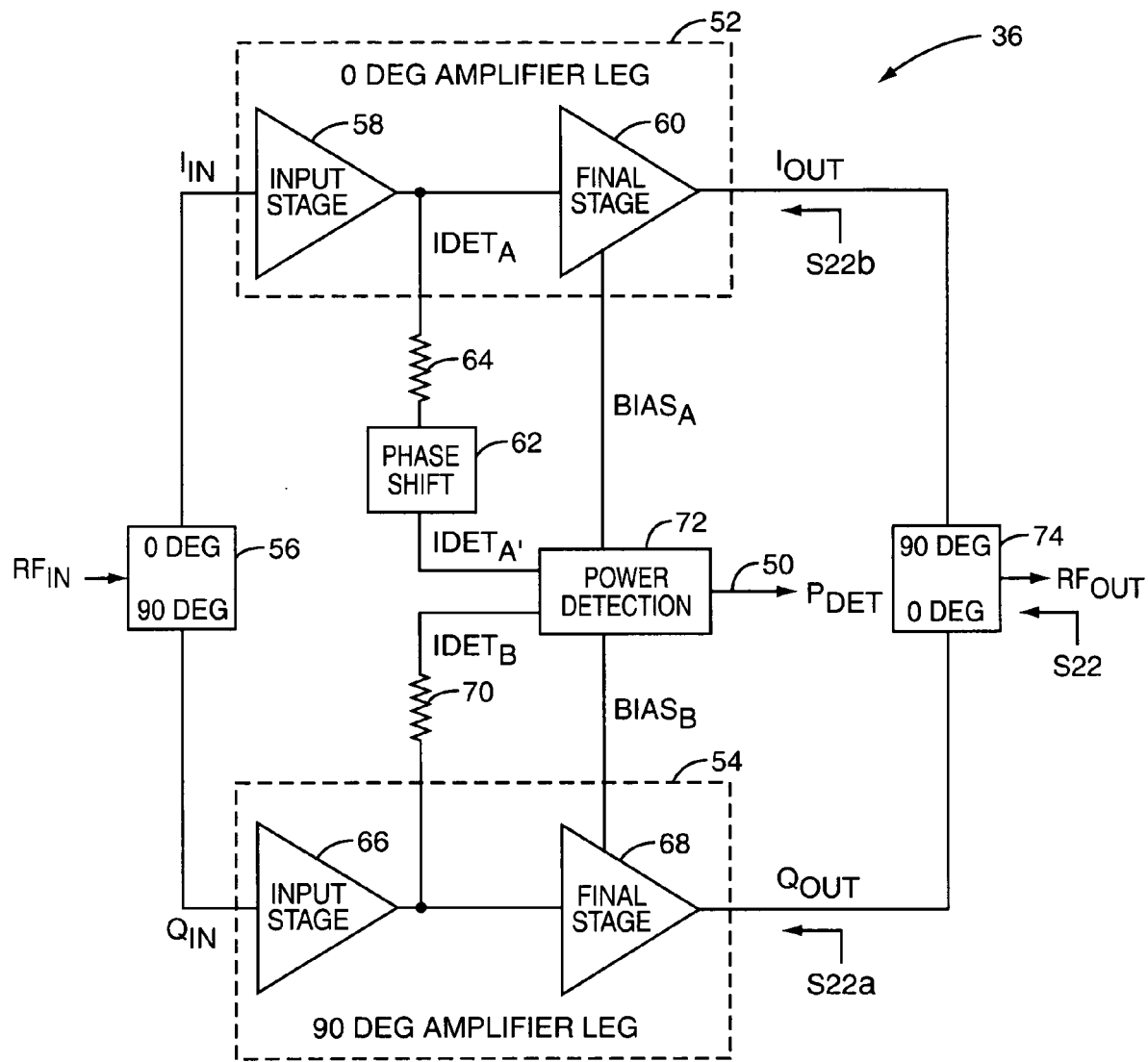
FIG. 2A illustrates a first exemplary embodiment of the power amplifier circuitry of FIG. 1 according to one embodiment of the present invention.

As illustrated in FIG. 2A, according to the present invention, the power amplifier circuitry 36 is a balanced amplifier including an in-phase amplifier leg 52 and a quadrature phase amplifier leg 54. A radio frequency (RF) input signal ($RF_{IN}$) from the modulator 34 (FIG. 1) is provided to a quadrature coupler 56, which is also referred to as a quadrature splitter. The quadrature coupler 56 operates to split the RF input signal ($RF_{IN}$) into an in-phase input signal ($I_{IN}$) and a quadrature phase input signal ($Q_{IN}$). The in-phase input signal ($I_{IN}$) is provided to the in-phase amplifier leg 52, and the quadrature phase input signal ($Q_{IN}$) is provided to the quadrature phase amplifier leg 54.

The in-phase amplifier leg 52 includes an input amplifier stage 58 and a final amplifier stage 60. It should be noted that the in-phase amplifier leg 52 may include any number of amplifier stages. Optional phase shift circuitry 62 is coupled to an input of the final amplifier stage 60. As illustrated, an optional attenuator 64 is used to couple the phase shift circuitry 62 to the input of the final amplifier stage 60. The phase shift circuitry 62 operates to adjust the phase of a detect signal ($IDET_A$) from the input of the final amplifier stage 60 to provide an adjusted detect signal ($IDET_A'$) that is essentially in phase with a detect signal ($IDET_B$) from the quadrature amplifier leg 54. More specifically, the phase shift circuitry 62 adjusts the phase of the detect signal ($IDET_A$) by essentially 90 degrees, thereby providing the adjusted detect signal ($IDET_A'$) that is essentially in phase with the detect signal ($IDET_B$). Rather than adjusting the phase of the detect signal ($IDET_A$), the phase shift circuitry 62 may alternatively operate to adjust a phase of the detect signal ($IDET_B$) or both of the detect signals ($IDET_A$, $IDET_B$) such that the detect signals ($IDET_A$, $IDET_B$) are essentially in phase. In other words, the phase of either of the detect signals ($IDET_A$, $IDET_B$) or the phase of both of the detect signals ($IDET_A$, $IDET_B$) may be adjusted as long as the power detection signal ($P_{DET}$) 50 is in sync with the output power of the power amplifier circuitry 36.

Similarly, the quadrature phase amplifier leg 54 includes an input amplifier stage 66 and a final amplifier stage 68. The quadrature phase amplifier leg 54 may include any number of amplifier stages. As illustrated, an optional attenuator 70 is used to couple the input of the final amplifier stage 68 to power detection system 72. It should be noted that the optional attenuators 64 and 70 may be desired to adjust the levels of the detect signals ($IDET_A$, $IDET_B$) to compensate any amplitude imbalance inherent in the quadrature coupler 56. As discussed below in more detail, the power detection system 72 combines the detect signals ($IDET_A'$, $IDET_B$) and uses the combined detect signal to provide the power detection signal ($P_{DET}$), which is indicative of the output power of the power amplifier circuitry 36.

The output signals ($I_{OUT}$, $Q_{OUT}$) of the amplifier legs 52, 54 are provided to a second quadrature coupler 74, which combines the output signals ($I_{OUT}$, $Q_{OUT}$) to provide a RF output signal ($RF_{OUT}$) to the matching network 38 (FIG. 1). The second quadrature coupler 74 may also be referred to as a quadrature combiner.

As the load impedance seen at the antenna 16 (FIG. 1) varies, the output of the power amplifier circuitry 36 and the currents through the amplifier legs 52, 54 also vary. However, since the power amplifier circuitry 36 is a balanced amplifier, the total current drawn by the final amplifier stages 60, 68 is relatively constant as the load impedance varies for a given output power level, as will be apparent to one of ordinary skill in the art upon reading this disclosure. More specifically, when the quadrature coupler 56, also referred to as a quadrature splitter, divides the input signal into two equal amplitude outputs and the amplifier legs 52 and 54 are of comparable design, the output return loss (S22) of the power amplifier circuitry 36 is defined as:

$$|S22|=0.5 \times |S22a-S22b|,$$

where S22a is the output return loss of the in-phase amplifier leg 52 and S22b is the output return loss of the quadrature phase amplifier leg 54. Thus, when the amplifier legs 52, 54 are matched, the output return losses (S22a, S22b) of the amplifier legs 52, 54 are approximately equal, and the output return loss (S22) of the power amplifier circuitry 36 is approximately zero. As a result, even though the currents in the amplifier legs 52, 54 vary, the total current drawn by the final amplifier stages 60, 68 is relatively constant as the load impedance varies for a given output power level.

In essence, the power detection system 72 combines the detect signal ($IDET_A$), which is indicative of the current in the final amplifier stage 60, and the detect signal ($IDET_B$), which is indicative of the current in the final amplifier stage 68, to provide the combined detect signal that is indicative of the total current in the final amplifier stages 60, 68. The power detection system 72 processes the combined signal to provide the power detection signal ($P_{DET}$). As discussed below, in one embodiment, the power detection system 72 rectifies and filters the combined signal to provide the power detection signal ($P_{DET}$). Accordingly, since the total current in the final amplifier stages 60, 68 is relatively constant as the load impedance varies for a given output power level, the power detection system 72 is tolerant to variations in the load impedance, which is also referred to as variations in the Voltage Standing Wave Ratio (VSWR).

The final amplifier stages 60, 68 and the input amplifier stages 58, 66 may be formed by a transistor array such as that described in U.S. Pat. Nos. 5,608,353, HBT POWER AMPLIFIER, issued Mar. 4, 1997; and 5,629,648, HBT POWER AMPLIFIER, issued May 13, 1997, which are assigned to RF Micro Devices, Inc. of 7628 Thorndike Road, Greensboro, N.C. 27409, and wherein the disclosures are incorporated herein by reference in their entirety. The final amplifier stages 60, 68 may also include bias networks that provide the bias signals ($BIAS_A$, $BIAS_B$). Exemplary bias networks capable of being used in association with the present invention are described in further detail in commonly owned and assigned U.S. Pat. No. 6,313,705, entitled BIAS NETWORK FOR HIGH EFFICIENCY RF LINEAR POWER AMPLIFIER, issued Nov. 6, 2001, the disclosure of which is incorporated herein by reference in its entirety. Upon understanding the present invention, those skilled in the art will be able to construct any number of bias networks that are compatible with the present invention.

Figure 2B:
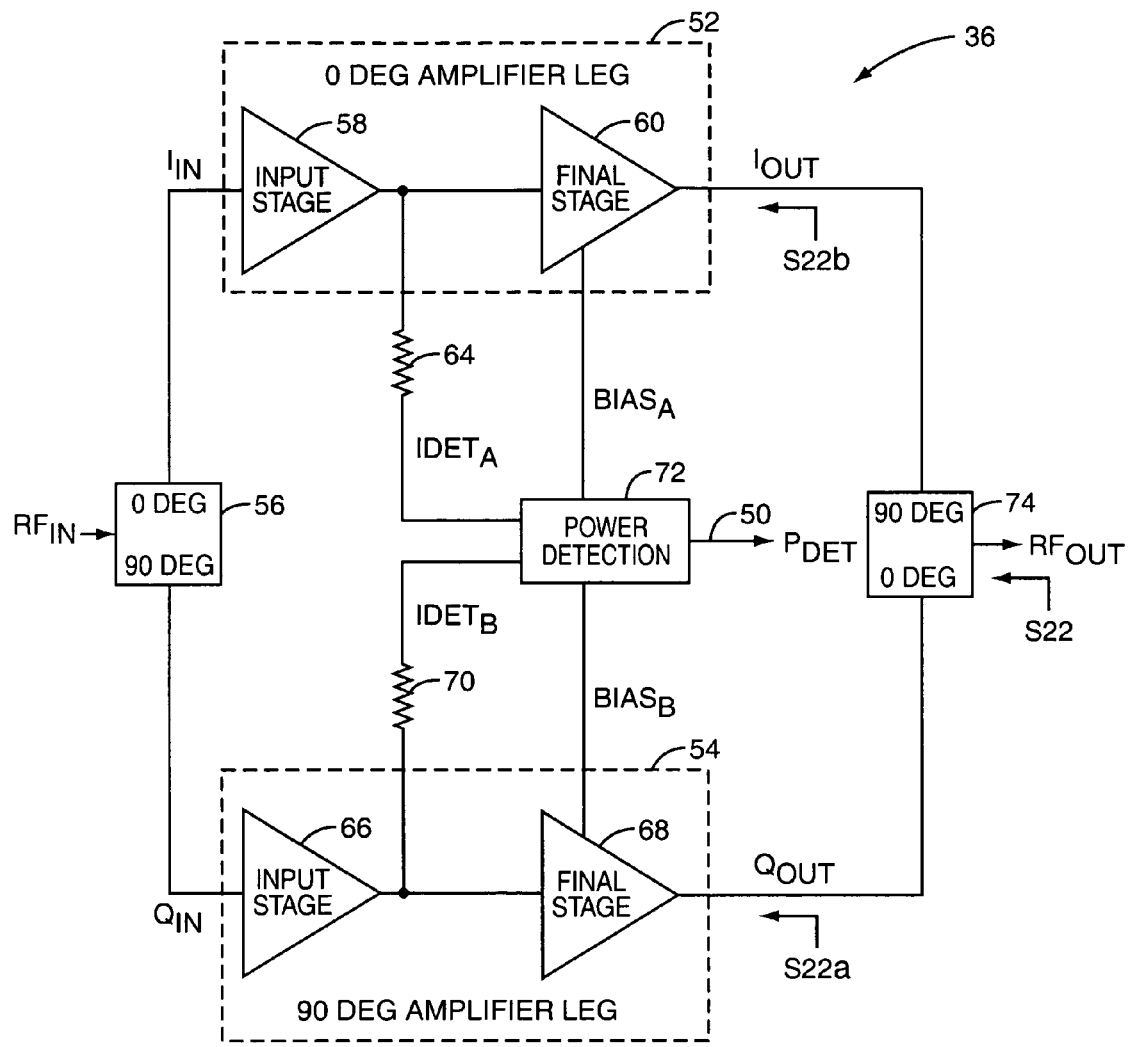
FIG. 2B illustrates a second exemplary embodiment of the power amplifier circuitry of FIG. 1 according to one embodiment of the present invention.

FIG. 2B illustrates another embodiment of the power amplifier circuitry 36. The embodiment of FIG. 2B is similar to than of FIG. 2A. However, in this embodiment, the power amplifier circuitry 36 does not include the phase shift circuitry 62. When the phase shift circuitry 62 is not used, as in this embodiment, the magnitude of the power detection signal ($P_{DET}$) is reduced due to the 90 degree phase difference between the detect signals ($IDET_A$, $IDET_B$). However, the reduction in the magnitude of the power detection signal ($P_{DET}$) does not adversely affect the performance of the present invention. Accordingly, the phase shift circuitry 62 is not necessary to the present invention. The phase shift circuitry 62 is optional and may be used in implementations where needed or desired.

Figure 3:
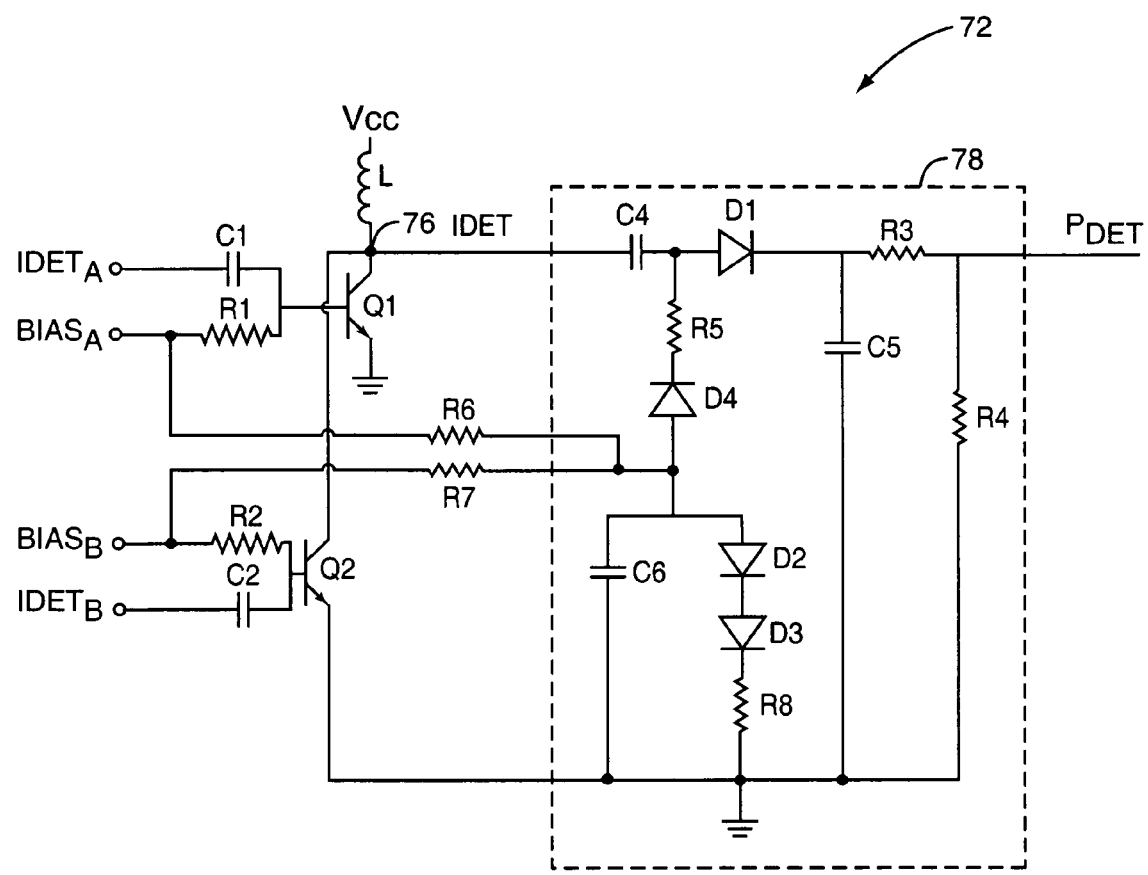
FIG. 3 illustrates an exemplary embodiment of the power detection system of FIGS. 2A and 2B.

FIG. 3 illustrates the power amplifier circuitry 36 of FIG. 2B and a detailed schematic of the power detection system 72 according to one embodiment of the present invention. The power detection system 72 is similar to that described in commonly owned and assigned U.S. Patent Application Publication No. 2003/0054778, entitled AMPLIFIER POWER DETECTION CIRCUITRY, published on Mar. 20, 2003, which is hereby incorporated herein by reference in its entirety.

In general, transistors Q1 and Q2 operate to combine the detect signals ($IDET_A$, $IDET_B$) to provide a combined detect signal (IDET) to a power detector 78. More specifically, capacitors C1, C2 couple the detect signals ($IDET_A$, $IDET_B$) to the transistors Q1, Q2, respectively. In one embodiment, the transistors Q1, Q2 are scaled versions of the final amplifier stages 60, 68, as described in U.S. Patent Application Publication No. 2003/0054778. Resistors R1, R2 couple bias signals ($BIAS_A$, $BIAS_B$) from the final amplifier stages 60, 68 (FIG. 2A) to the transistors Q1, Q2, respectively. The collectors of the transistors Q1, Q2 are coupled such that the transistors Q1, Q2 amplify the detect signals ($IDET_A$, $IDET_B$) and sum the amplified detect signals ($IDET_A$, $IDET_B$) at node 76 to provide the combined detect signal (IDET) to the power detector 78. A supply voltage ($V_{CC}$) is provided to the collectors of the transistors Q1, Q2 via inductor L.

The power detector 78 receives the combined detect signal (IDET) from node 76 and provides the combined detect signal (IDET) to a diode D1 via capacitor C4. The diode D1 rectifies the combined detect signal (IDET), and capacitor C5 and resistors R3 and R4 filter the rectified signal to create the power detection signal ($P_{DET}$) proportional to the transmit power associated with the output signal of the power amplifier circuitry 36. The capacitor C5 filters RF from the power detect signal ($P_{DET}$), and resistor R4, the load resistance of the detector, is selected to set the level of the power detect signal ($P_{DET}$).

In order to improve the low power performance and dynamic range of the power detection system 72, a small amount of bias current can be applied to diode D1. Accordingly, the anode of diode D2 is connected to resistors R6 and R7, which are coupled to the bias signals $BIAS_A$, $BIAS_B$, respectively. The cathode of diode D2 is connected to anode of diode D3, and the cathode of diode D3 is connected to ground via resistor R8. To compensate for the voltage drop across diode D3, diode D4 is coupled between the anode of diode D2 and the resistor R5, as shown, and operates as a level shifting diode.

The voltage appearing at the anode of diode D2 is controlled by the bias signals $BIAS_A$, $BIAS_B$ from the final amplifier stages 60, 68 (FIG. 2B). In this way, diodes D2 and D3 function as a voltage source from which a variable amount of DC current may be drawn by the rectifier diode D1. In practice, the diodes D2 and D3 may be composed of 8 or 16 parallel diodes. The paralleling of many diodes lowers the voltage appearing at the anode of diode D2.

The use of a diode voltage source to supply the bias current for the rectifier diode D1 provides temperature and process stability to reduce circuit performance variations due to temperature and diode manufacturing process variations. At higher temperatures, the diode potential drop from anode to cathode for a given diode current decreases. If the bias voltage source, represented by diodes D2 and D3, were instead a constant voltage source not varying with temperature, then an increase in temperature would result in an increase in the DC voltage appearing at resistor R4 (all other things being equal), since the voltage at resistor R4 is equal to the voltage at diode D2 minus the potential drop across diode D4, resistor R5, and diode D1. However, the use of the diodes D2 and D3 as the bias voltage source will provide a temperature compensating effect, since at higher temperatures the voltage appearing at the anode of diode D2 will be reduced in a similar amount to the reduction in the potential drop across D1 due to temperature. Such a configuration also minimizes variations in circuit performance due to variations in the diode manufacturing process. Capacitor C6 is an RF bypass used to ensure that the RF load impedance of transistor Q1 and Q2, represented by resistor R5, does not substantially change with the addition of the bias circuitry R6, R7, D2, and D3.

The power detection system 72 illustrated in FIG. 3 is exemplary and is not intended to limit the scope of the present invention. Various other embodiments of the power detection system 72 will be apparent to one of ordinary skill in the art upon reading this disclosure. Further, the embodiment of the power detector 78 illustrated in FIG. 3 is also exemplary. Other embodiments are illustrated in U.S. Patent Application Publication No. 2003/0054778, and further embodiments of the power detector 78 will be apparent to one of ordinary skill in the art upon reading this disclosure.

Figure 4:
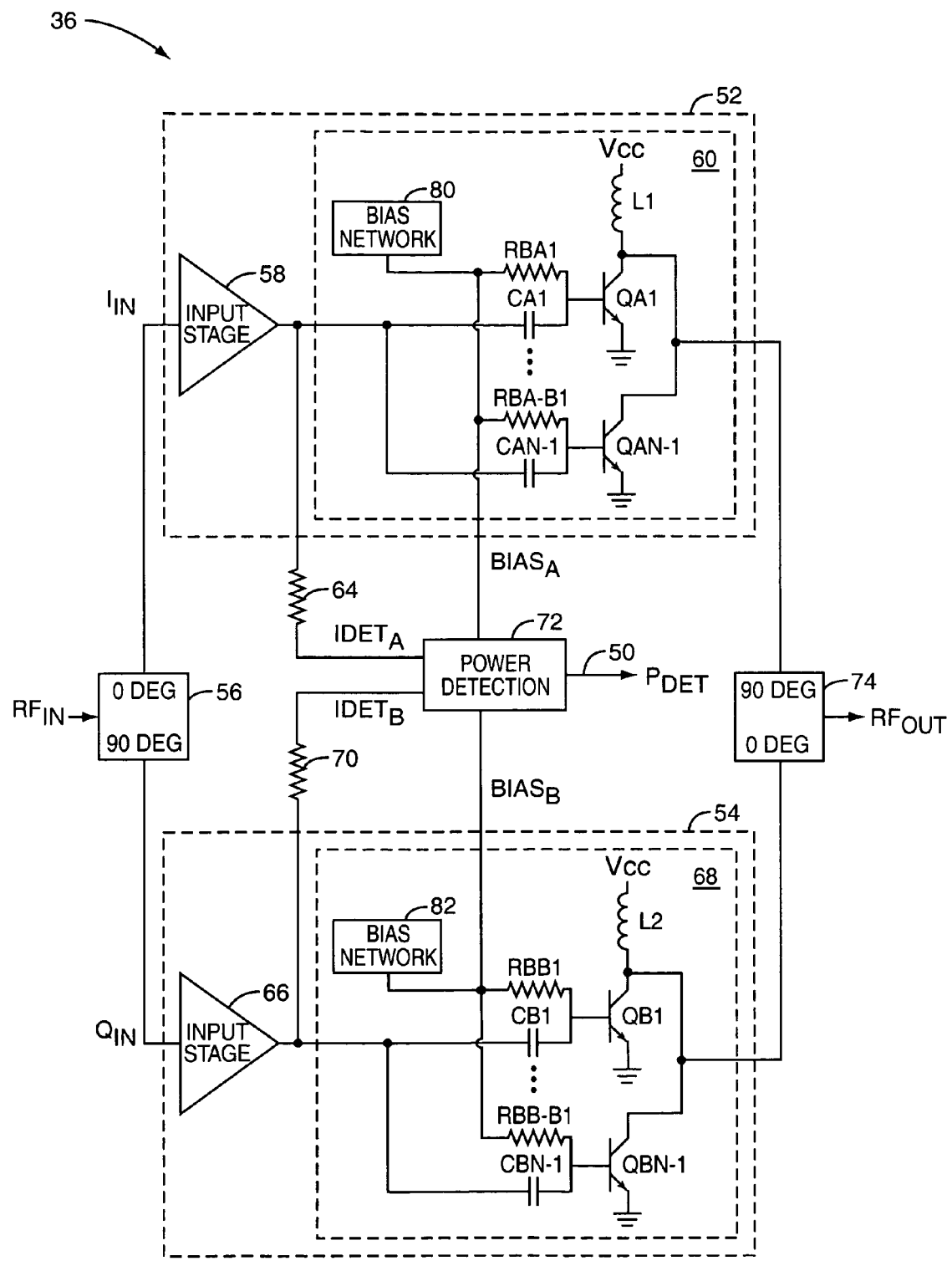
FIGS. 4 and 5 are a more detailed illustration of the power amplifier circuitry of FIG. 2B and the power detection system of FIG. 3 according to one embodiment of the present invention.
Figure 5:
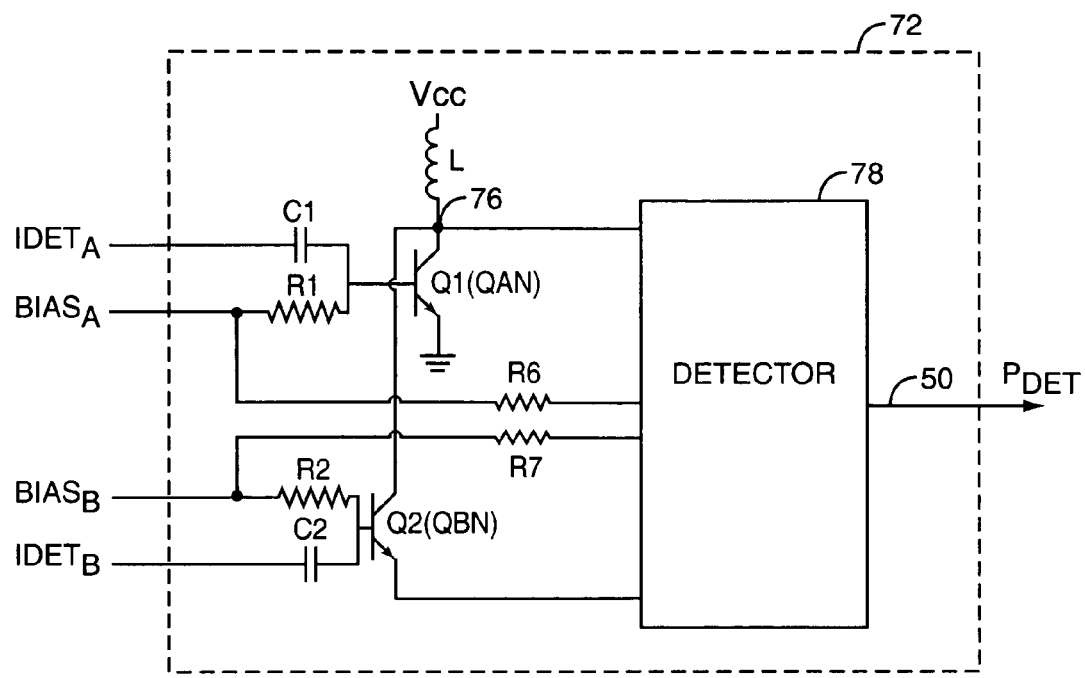

FIGS. 4 and 5 are a more detailed illustration of the final amplifier stages 60, 68 of the power amplifier circuitry 36 of FIG. 2B with respect to the power detection system 72. Due to the number of elements shown in FIGS. 4 and 5, the details of the power detection circuitry 72 are shown in FIG. 5. However, for the following discussion, FIGS. 4 and 5 are discussed as a single FIGURE with the power detection circuitry 72 of FIG. 4 including the details shown in FIG. 5.

As illustrated, the final amplifier stage 60 of the in-phase amplifier leg 52 may be provided by an array of identical transistors QA1 through QAN, where the transistor QAN is the transistor Q1 of the power detection system 72. The transistors QA1 through QAN-1 are used in the final amplifier stage 60 and the transistor QAN, transistor Q1, is used in the power detection system 72. In this configuration, each transistor QA1 through QAN receives identical bias from bias network 80 through resistors RBA1 through RBAN, where RBAN is the resistor R1 of the power detection system 72, and RF drive from the input amplifier stage 58 through capacitors CA1 through CAN, where CAN is the capacitor C1 of the power detection system 72.

Notably, the collectors of transistors QA1 through QAN-1 are coupled together to provide a common output signal to the quadrature combiner 74. The transistors QA1 through QAN are preferably heterojunction bipolar transistors (HBTs) formed on a single semiconductor and equally sized to form a transistor array. However, the inventive concepts defined herein are independent of technology (Si, GaAs, SiGe, etc.) as well as device type (BJT, FET, MESFET, HBT, etc.).

Similarly, the final amplifier stage 68 of the quadrature phase amplifier leg 54 may be provided by an array of identical transistors QB1 through QBN, where the transistor QBN is the transistor Q2 of the power detection system 72. The transistors QB1 through QBN-1 are used in the final amplifier stage 68 and the transistor QBN, transistor Q2, is used in the power detection system 72. In this configuration, each transistor QB1 through QBN receives identical bias from bias network 82 through resistors RBB1 through RBBN, where RBBN is the resistor R2 of the power detection system 72, and RF drive from the input amplifier stage 66 through capacitors CB1 through CBN, where CBN is the capacitor C2 of the power detection system 72. Notably, the collectors of transistors QB1 through QBN-1 are coupled together to provide a common output signal to the quadrature combiner 74. The quadrature combiner 74 combines the signals from amplifier legs 52 and 54 and provides the necessary impedance matching between the overall amplifier output and the collectors of QA1 through QAN-1 and QB1 through QBN-1. The transistors QB1 through QBN are preferably heterojunction bipolar transistors (HBTs) formed on a single semiconductor and equally sized to form a transistor array. However, the inventive concepts defined herein are independent of technology (Si, GaAs, SiGe, etc.) as well as device type (BJT, FET, MESFET, HBT, etc.).

Accordingly, the transistors Q1, Q2 of the power detection system 72 are scaled versions of the final amplifier stages 60, 68 such that the power detection system 72 efficiently detects the output power of the power amplifier circuitry 36. Further, due to the balanced architecture of the power amplifier circuitry 36, the total current of the final amplifier stages 60, 68, and thus the detect signals ($IDET_A$, $IDET_B$), is relatively constant as the load impedance at the $RF_{OUT}$ port of the output combiner 74 varies for a given output power level. Thus, the power detection system 72 provides the power detection signal ($P_{DET}$) that is relatively constant as the load impedance varies for a given output power level.

Those skilled in the art will recognize improvements and modifications to the preferred embodiments of the present invention. All such improvements and modifications are considered within the scope of the concepts disclosed herein and the claims that follow.

What is claimed is:

1. A system for detecting an output power of power amplifier circuitry comprising:
    in-phase amplifier circuitry comprising an input amplifier stage and a final amplifier stage and adapted to amplify an in-phase input signal to provide an in-phase output signal;
    quadrature phase amplifier circuitry comprising an input amplifier stage and a final amplifier stage and adapted to amplify a quadrature phase input signal to provide a quadrature phase output signal;
    quadrature combiner circuitry adapted to provide an amplified radio frequency (RF) output signal by combining the in-phase output signal and the quadrature phase output signal; and
    a power detection system adapted to provide a power detection signal indicative of an output power of the power amplifier circuitry based on an in-phase detect signal indicative of a current through the final amplifier stage of the in-phase amplifier circuitry and a quadrature phase detect signal indicative of a current through the final amplifier stage of the quadrature phase amplifier circuitry.

2. The system of claim 1 wherein the power detection system comprises:
    a first input adapted to receive the in-phase detect signal from an input of the final amplifier stage of the in-phase amplifier circuitry; and
    a second input adapted to receive the quadrature phase detect signal from an input of the final amplifier stage of the quadrature phase amplifier circuitry.

3. The system of claim 1 wherein the power detection system is further adapted to combine the in-phase detect signal and the quadrature phase detect signal to provide a combined detect signal, and provide the power detection signal based on the combined detect signal.

4. The system of claim 1 further comprising a control system adapted to control an output power of the in-phase amplifier circuitry and the quadrature phase amplifier circuitry based on the power detection signal.

5. The system of claim 1 wherein the power amplifier circuitry is included in a transmitter of a mobile terminal.

6. The system of claim 1 further comprising phase shift circuitry adapted to adjust a phase of the in-phase detect signal prior to providing the in-phase detect signal to the power detection system such that the in-phase detect signal and the quadrature phase detect signal are essentially in phase.

7. The system of claim 1 wherein the power detection system comprises:
 a first transistor adapted to amplify the in-phase detect signal to provide an amplified in-phase detect signal;
 a second transistor adapted to amplify the quadrature phase detect signal to provide an amplified quadrature phase detect signal, wherein an output of the first transistor is coupled to an output of the second transistor such that the amplified in-phase detect signal is combined with the amplified quadrature phase detect signal to provide a combined detect signal; and
 detection circuitry adapted to provide the power detection signal based on the combined detect signal.

8. The system of claim 7 wherein the detection circuitry comprises:
 a rectifier diode having an anode adapted to rectify the combined detect signal to provide a rectified signal; and
 low-pass filtering circuitry adapted to filter the rectified signal to provide the power detection signal.

9. The system of claim 8 wherein the detector circuitry further comprises biasing circuitry adapted to bias the rectifier diode.

10. The system of claim 7 wherein the first transistor is a scaled version of the final amplifier stage of the in-phase amplifier circuitry, and the second transistor is a scaled version of the final amplifier stage of the quadrature phase amplifier circuitry.

11. The system of claim 1 further comprising quadrature coupling circuitry adapted to provide the in-phase input signal and the quadrature phase input signal based on a radio frequency (RF) input signal.

12. A system for detecting an output power of power amplifier circuitry comprising:
 a balanced power amplifier comprising in-phase amplifier circuitry adapted to amplify an in-phase radio frequency (RF) signal and quadrature phase amplifier circuitry adapted to amplify a quadrature phase RF input signal; and
 a power detection system adapted to provide a power detection signal indicative of an output power of the power amplifier circuitry based on an in-phase detect signal indicative of a current through a final amplifier stage of the in-phase amplifier circuitry and a quadrature phase detect signal indicative of a current through a final amplifier stage of the quadrature phase amplifier circuitry, wherein a total of the current through the final amplifier stage of the in-phase amplifier circuitry and the current through the final amplifier stage of the quadrature phase amplifier circuitry is relatively constant as load impedance varies for a given power level of the balanced power amplifier.

13. A system for detecting an output power of power amplifier circuitry comprising:
 in-phase amplifier circuitry adapted to amplify an in-phase input signal to provide an in-phase output signal;
 quadrature phase amplifier circuitry adapted to amplify a quadrature phase input signal to provide a quadrature phase output signal;
 quadrature combiner circuitry adapted to provide an amplified radio frequency (RF) output signal by combining the in-phase output signal and the quadrature phase output signal; and
 a power detection system adapted to provide a power detection signal indicative of an output power of the power amplifier circuitry based on an in-phase detect signal indicative of a current through the in-phase amplifier circuitry and a quadrature phase detect signal indicative of a current through the quadrature phase amplifier circuitry.

14. The system of claim 13 wherein the power detection system is further adapted to combine the in-phase detect signal and the quadrature phase detect signal to provide a combined detect signal, and provide the power detection signal based on the combined detect signal.

15. The system of claim 13 further comprising phase shift circuitry adapted to adjust a phase of the in-phase detect signal prior to providing the in-phase detect signal to the power detection system such that the in-phase detect signal and the quadrature phase detect signal are essentially in phase.

16. The system of claim 13 further comprising phase shift circuitry adapted to adjust a phase of the quadrature phase detect signal prior to providing the quadrature phase detect signal to the power detection system such that the in-phase detect signal and the quadrature phase detect signal are essentially in phase.

17. The system of claim 13 further comprising phase shift circuitry adapted to adjust a phase of the in-phase detect signal and a phase of the quadrature phase detect signal prior to providing the in-phase detect signal and the quadrature phase detect signal to the power detection system such that the in-phase detect signal and the quadrature phase detect signal are essentially in phase.

18. The system of claim 13 further comprising phase shift circuitry adapted to adjust a phase of the in-phase detect signal prior to providing the in-phase detect signal to the power detection system.

19. The system of claim 13 further comprising phase shift circuitry adapted to adjust a phase of the quadrature phase detect signal prior to providing the quadrature phase detect signal to the power detection system.

20. The system of claim 13 further comprising phase shift circuitry adapted to adjust a phase of the in-phase detect signal and a phase of the quadrature phase detect signal prior to providing the in-phase detect signal and the quadrature phase detect signal to the power detection system.

21. The system of claim 13 wherein the power detection system comprises:
 a first transistor adapted to amplify the in-phase detect signal to provide an amplified in-phase detect signal;
 a second transistor adapted to amplify the quadrature phase detect signal to provide an amplified quadrature phase detect signal, wherein an output of the first transistor is coupled to an output of the second transistor such that the amplified in-phase detect signal is combined with the amplified quadrature phase detect signal to provide a combined detect signal; and detection circuitry adapted to provide the power detection signal based on the combined detect signal.

22. The system of claim 21 wherein the detection circuitry comprises:

a rectifier diode having an anode adapted to rectify the combined detect signal to provide a rectified signal; and low-pass filtering circuitry adapted to filter the rectified signal to provide the power detection signal.

23. The system of claim 22 wherein the detector circuitry further comprises biasing circuitry adapted to bias the rectifier diode.

24. The system of claim 21 wherein the first transistor is a scaled version of a final amplifier stage of the in-phase amplifier circuitry, and the second transistor is a scaled version of a final amplifier stage of the quadrature phase amplifier circuitry.

* * * * *